(12) United States Patent
Miki (10) Patent No.: US 10,320,154 B2
(45) Date of Patent: Jun. 11, 2019

(54) ESD PROTECTION DEVICE AND MANUFACTURING METHOD FOR ESD PROTECTION DEVICE

(71) Applicant: Murata Manufacturing Co., Ltd., Nagaokakyo-shi, Kyoto-fu (JP)

(72) Inventor: Takeshi Miki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 82 days.

(21) Appl. No.: 15/795,385

(22) Filed: Oct. 27, 2017

(65) Prior Publication Data

US 2018/0062354 A1 Mar. 1, 2018

Related U.S. Application Data

(63) Continuation of application No. PCT/JP2016/066925, filed on Jun. 7, 2016.

(30) Foreign Application Priority Data

Jun. 22, 2015 (JP) ................................. 2015-125176

(51) Int. Cl.
*H01T 4/12* (2006.01)
*H01T 1/20* (2006.01)
(Continued)

(52) U.S. Cl.
CPC ................. *H01T 4/12* (2013.01); *H01T 1/20* (2013.01); *H01T 2/02* (2013.01); *H01T 4/10* (2013.01);
(Continued)

(58) Field of Classification Search
CPC .................................... H01T 4/12; H01T 1/20
See application file for complete search history.

(56) References Cited

U.S. PATENT DOCUMENTS 7,994,893 B2 * 8/2011 Matsuoka ............. C04B 35/453
338/20
8,471,672 B2 * 6/2013 Feichtinger .............. H01C 7/10
338/20
(Continued)

FOREIGN PATENT DOCUMENTS

WO 2011/096335 A1 8/2011
WO 2013/031605 A1 3/2013
(Continued)

OTHER PUBLICATIONS

Official Communication issued in International Patent Application PCT/JP2016/066925, dated Sep. 6, 2016.

*Primary Examiner* — Scott Bauer
(74) *Attorney, Agent, or Firm* — Keating & Bennett, LLP (57) ABSTRACT

An ESD protection device includes a multilayer substrate, first and second discharge electrodes, and a discharge auxiliary electrode. Discharge portions of the first and second discharge electrodes are opposed to each other in a lamination direction of insulating layers with the discharge auxiliary electrode interposed between both the discharge portions. A cavity is provided within the multilayer substrate in at least one of a region positioned adjacent to or in a vicinity of the discharge portion of the first discharge electrode on an opposite side to the discharge auxiliary electrode and a region positioned adjacent to or in a vicinity of the discharge portion of the second discharge electrode on an opposite side to the discharge auxiliary electrode.

20 Claims, 5 Drawing Sheets

(51) Int. Cl.
*H01T 4/10* (2006.01)
*H02H 9/04* (2006.01)
*H05K 1/02* (2006.01)
*H05K 3/46* (2006.01)
*H01T 2/02* (2006.01)

(52) U.S. Cl.
CPC ........... *H02H 9/044* (2013.01); *H05K 1/0259* (2013.01); *H05K 3/4629* (2013.01); *H05K 1/026* (2013.01)

(56) References Cited

U.S. PATENT DOCUMENTS

| | | |
|---|---|---|
| 2009/0067113 A1* | 3/2009 | Urakawa .................. H01T 4/12 361/220 |
| 2009/0296294 A1* | 12/2009 | Liu ........................... H01T 4/12 361/56 |
| 2013/0201585 A1 | 8/2013 | Ikeda et al. |
| 2014/0177114 A1 | 6/2014 | Otsubo |
| 2014/0240878 A1 | 8/2014 | Otsubo |
| 2016/0081172 A1 | 3/2016 | Otsubo |
| 2016/0104999 A1 | 4/2016 | Yasunaka et al. |

FOREIGN PATENT DOCUMENTS

| | | |
|---|---|---|
| WO | 2013/065672 A1 | 5/2013 |
| WO | 2014/208215 A1 | 12/2014 |
| WO | 2015/005100 A1 | 1/2015 |

* cited by examiner

ESD PROTECTION DEVICE AND MANUFACTURING METHOD FOR ESD PROTECTION DEVICE

CROSS REFERENCE TO RELATED APPLICATIONS

This application claims the benefit of priority to Japanese Patent Application No. 2015-125176 filed on Jun. 22, 2015 and is a Continuation Application of PCT Application No. PCT/JP2016/066925 filed on Jun. 7, 2016. The entire contents of each application are hereby incorporated herein by reference.

BACKGROUND OF THE INVENTION

1. Field of the Invention

The present invention relates to an ESD protection device, and more particularly to an ESD protection device in which degradation of IR (Insulation Resistance) is significantly reduced or prevented.

The present invention further relates to a manufacturing method for an ESD protection device, and more particularly to a manufacturing method for an ESD protection device in which degradation of IR is significantly reduced or prevented.

2. Description of the Related Art

Taking countermeasures to ESD (Electro-Static Discharge) is important in electronic devices. The ESD is a vigorous discharge phenomenon that occurs, when a charged substance (for example, a human body) comes into contact with or approaches very close to another substance (for example, an electronic device), from the charged substance toward the other substance. The occurrence of the ESD on an electronic device may damage the electronic device or cause the electronic device to malfunction in some cases. Therefore, countermeasures to the ESD are needed.

One example of the ESD countermeasures in electronic devices is to employ an ESD protection device (for example, an ESD protection component). The ESD protection device has a structure including a pair of discharge electrodes disposed in a spaced relation opposing to each other, and the ESD protection device is electrically connected between a signal line and a ground when included in an electronic device.

During ordinary operation, the ESD protection device has high resistance, and a signal does not flow from the signal line to the ground through the ESD protection device. However, when the ESD occurs on the electronic device and an excessive voltage is applied to the signal line, discharge is caused between the discharge electrodes of the ESD protection device, thus enabling static electricity to be released from the signal line to the ground.

Figure 5:
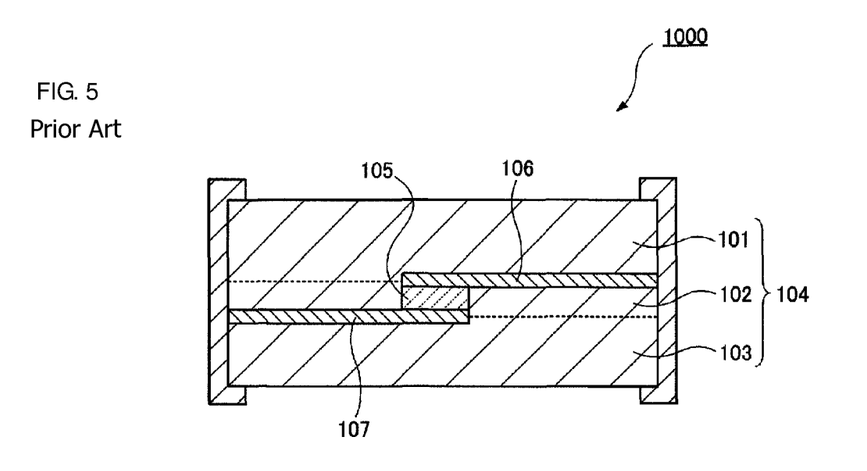
FIG. 5 is a sectional view of an ESD protection device 1000 of related art.

That type of ESD protection device is disclosed in International Publication No. WO2011/096335A1. FIG. 5 shows an ESD protection device 1000 disclosed in International Publication No. WO2011/096335A1. The ESD protection device 1000 has a structure including a first discharge electrode (in-plane connection conductor) 106 and a second discharge electrode (in-plane connection conductor) 107 arranged in an opposing relation inside a multilayer substrate 104, which includes laminated insulating layers 101 to 103, with a discharge auxiliary electrode (mixed portion) 105 interposed therebetween. The discharge auxiliary electrode 105 exhibits high resistance during ordinary operation, but it causes discharge between the first discharge electrode 106 and the second discharge electrode 107 when a voltage in excess of a predetermined threshold is applied between the first discharge electrode 106 and the second discharge electrode 107.

Many minute voids are dispersedly formed in the discharge auxiliary electrode 105 of the ESD protection device 1000. It is explained in International Publication No. WO2011/096335A1 that the voids serve to prevent a short circuit and to adjust ESD characteristics such as a peak voltage value.

Figure 6:
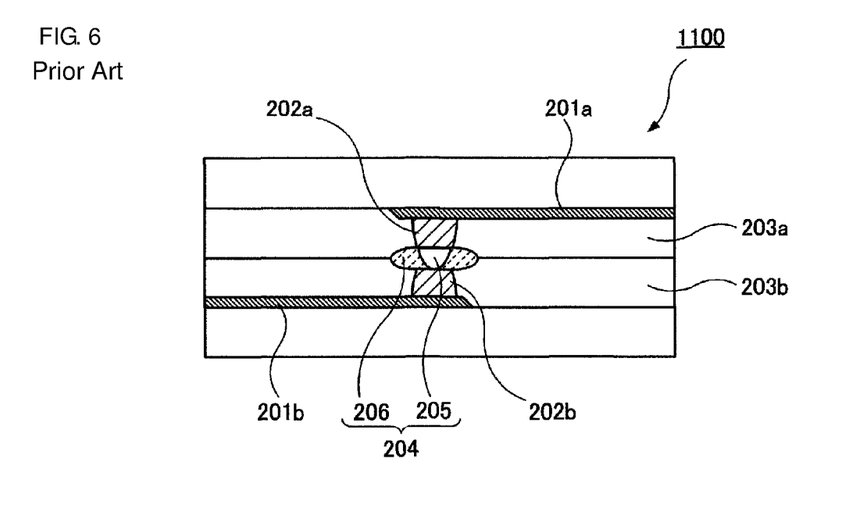
FIG. 6 is a sectional view of an ESD protection device 1100 of related art.

Another ESD protection device is disclosed in International Publication No. WO2014/208215A1. FIG. 6 shows an ESD protection device 1100 disclosed in International Publication No. WO2014/208215A1. The ESD protection device 1100 has a structure that a first via conductor 202a electrically connected to a first wiring line 201a and a second via conductor 202b electrically connected to a second wiring line 201b are arranged in an opposing relation in a discharge gap region 204 which is formed between a first insulating layer 203a and a second insulating layer 203b. The discharge gap region 204 has a structure that a cavity 205 formed at a center is surrounded by a discharge auxiliary electrode 206.

It is explained in International Publication No. WO2014/208215A1 that, in the ESD protection device 1100, the structure of surrounding the cavity 205 in the discharge gap region 204 by the discharge auxiliary electrode 206 serves to facilitate the occurrence of discharge.

An ESD protection device preferably includes characteristics that the device reliably causes discharge when the applied voltage exceeds a predetermined threshold voltage, without causing discharge and a short circuit during ordinary operation, and that even if discharge is caused, the discharge auxiliary electrode and the like are not susceptible to degradation of IR (for example, degradation of insulation resistance due to heat), and they are able to be continuously operated even after the discharge.

In the ESD protection device 1000 disclosed in International Publication No. WO2011/096335A1, however, the surroundings of the discharge auxiliary electrode 105 are completely covered with the insulating layer 102, the first discharge electrode 106, and the second discharge electrode 107. Accordingly, in the event of discharge, heat generated by the discharge is not able to be dissipated and degradation of IR in the discharge auxiliary electrode 105 and the like is caused due to the heat in some cases although the minute voids are formed in the discharge auxiliary electrode 105. Thus, the ESD protection device 1000 has the problem that it is not able to be used repeatedly.

On the other hand, in the ESD protection device 1100 disclosed in International Publication No. WO2014/208215A1, the cavity 205 is formed in the discharge gap region 204, and the heat generated by the discharge is able to be dissipated via the cavity 205 even when discharge is caused between the first via conductor 202a and the second via conductor 202b. However, in the case of desiring the threshold voltage at which the discharge starts to be set to a relatively low level in the ESD protection device 1100, a thickness of the discharge auxiliary electrode 206 has to be reduced and a height of the cavity 205 is also necessarily reduced in that case. The reduction of the height of the cavity 205 leads to a risk that a short circuit may occur between the first via conductor 202a and the second via conductor 202b. Thus, the ESD protection device 1100 has the problem that short-circuit resistance is low.

SUMMARY OF THE INVENTION

In view of the above, a preferred embodiment of the present invention provides an ESD protection device each including a multilayer substrate that includes a plurality of laminated insulating layers, a first discharge electrode and a second discharge electrode each of which is located between different layers of the multilayer substrate, and each of which includes a discharge portion at or near a tip end thereof, a through-hole that penetrates between front and rear principal surfaces of at least one of the insulating layers, and a discharge auxiliary electrode that is filled in the through-hole, the discharge portion of the first discharge electrode and the discharge portion of the second discharge electrode being opposed to each other in a lamination direction of the insulating layers with the discharge auxiliary electrode interposed between both the discharge portions, wherein a cavity is provided within the multilayer substrate in at least one of a region positioned adjacent to or in a vicinity of the discharge portion of the first discharge electrode on an opposite side to the discharge auxiliary electrode and a region positioned adjacent to or in a vicinity of the discharge portion of the second discharge electrode on an opposite side to the discharge auxiliary electrode.

When the multilayer substrate is viewed in the lamination direction of the insulating layers, the discharge auxiliary electrode may be at least partly overlapped with the discharge portion of the first discharge electrode and/or the discharge portion of the second discharge electrode, and the discharge auxiliary electrode may be in direct contact with the cavity in a region where the discharge auxiliary electrode is not overlapped with the discharge portion. In that case, heat generated by discharge is able to be dissipated to the cavity from the discharge auxiliary electrode through the region where the discharge auxiliary electrode is in direct contact with the cavity, and degradation of IR is able to be significantly reduced or prevented.

The cavity may be provided within the multilayer substrate in each of the region positioned adjacent to or in a vicinity of the discharge portion of the first discharge electrode on the opposite side to the discharge auxiliary electrode and the region positioned adjacent to or in a vicinity of the discharge portion of the second discharge electrode on the opposite side to the discharge auxiliary electrode. In that case, since the heat generated by the discharge is able to be dissipated through two cavities, the degradation of IR is able to be significantly reduced or prevented more reliably.

When the multilayer substrate is viewed in the lamination direction of the insulating layers, the cavity and the discharge auxiliary electrode may be overlapped with each other in the same or substantially the same shape and the same or substantially the same size. In that case, the same jig (for example, the same punch with a certain diameter) is able to form the through-holes that define the cavity and the discharge auxiliary electrode, and productivity in manufacturing of the ESD protection device is able to be increased.

As an alternative, when the multilayer substrate is viewed in the lamination direction of the insulating layers, a size of the cavity may be larger than a size of the discharge auxiliary electrode, and the cavity may include the discharge auxiliary electrode. In that case, since the cavity includes a larger volume, the degradation of IR is able to be significantly reduced or prevented.

The discharge auxiliary electrode may include at least one solid component selected from among, for example, a conductive particle, a semiconductor particle, a conductive particle coated with an inorganic material, and an insulating particle. In that case, when a voltage applied between the first discharge electrode and the second discharge electrode exceeds a predetermined threshold voltage, the discharge is able to be reliably occur between the first discharge electrode and the second discharge electrode.

Furthermore, the preferred embodiments of the present invention provide a manufacturing method for an ESD protection device in which a cavity is provided within a multilayer substrate in at least one of a region positioned adjacent to or in a vicinity of a discharge portion of a first discharge electrode on an opposite side to a discharge auxiliary electrode and a region positioned adjacent to or in a vicinity of a discharge portion of a second discharge electrode on an opposite side to the discharge auxiliary electrode, the manufacturing method including a step of fabricating ceramic green sheets, a step of preparing a conductive paste for the discharge electrode, a step of preparing a mixed paste for the discharge auxiliary electrode, a step of preparing a cavity forming paste that melts, evaporates, or dissolves in response to firing, a step of forming, in a predetermined one of the ceramic green sheets, a through-hole that penetrates between front and rear principal surfaces of the one ceramic green sheet, and filling the mixed paste for the discharge auxiliary electrode in the through-hole, a step of forming, in predetermined another one of the ceramic green sheets, a through-hole that penetrates between front and rear principal surfaces of the other one ceramic green sheet, and filling the cavity forming paste in the through-hole, a step of applying the conductive paste for the discharge electrode, in a predetermined shape, onto at least one principal surface of each of predetermined still other ones of the ceramic green sheets, a step of fabricating an unfired laminate by laminating the ceramic green sheets in a predetermined order, and a step of fabricating the multilayer substrate by firing the unfired laminate.

With ESD protection devices according to various preferred embodiments of the present invention, since the heat generated by the discharge is able to be dissipated via the cavity, the degradation of IR is significantly reduced or prevented.

With the manufacturing methods for the ESD protection devices according to the preferred embodiments of the present invention, it is possible to manufacture the ESD protection device in which the degradation of IR is significantly reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 1A and 1B are each a sectional view of an ESD protection device 100 according to a first preferred embodiment of the present invention. FIG. 1B is a section taken along a line X-X in FIG. 1A.

FIGS. 3A and 3B are each a sectional view of an ESD protection device 800 according to an eighth preferred embodiment of the present invention. FIG. 3B is a section taken along a line X-X in FIG. 3A.

FIGS. 4A and 4B are each a sectional view of an ESD protection device 900 according to a ninth preferred embodiment of the present invention. FIG. 4B is a section taken along a line X-X in FIG. 4A.

DETAILED DESCRIPTION OF THE PREFERRED EMBODIMENTS

Preferred embodiments of the present invention will be described below with reference to the drawings.

It is to be noted that the following preferred embodiments represent examples of the present invention for merely illustrative purposes, and that the present invention is not limited to matters disclosed in the following preferred embodiments. The matters disclosed in the different preferred embodiments are able to be combined with each other in practical applications, and modified preferred embodiments in those cases are also included in the scope of the present invention. The drawings serve to assist understanding of the preferred embodiments, and they are not always exactly drawn in a strict sense. In some cases, for instance, dimension ratios between constituent elements themselves or dimension ratios of distances between elements or features, which are shown in the drawings, are not in match with the dimension ratios described in the Description. Furthermore, some of the elements or features, which are explained in the Description, are omitted from the drawings, or they are shown in a reduced number on a case-by-case basis.

First Preferred Embodiment

Figure 1A:
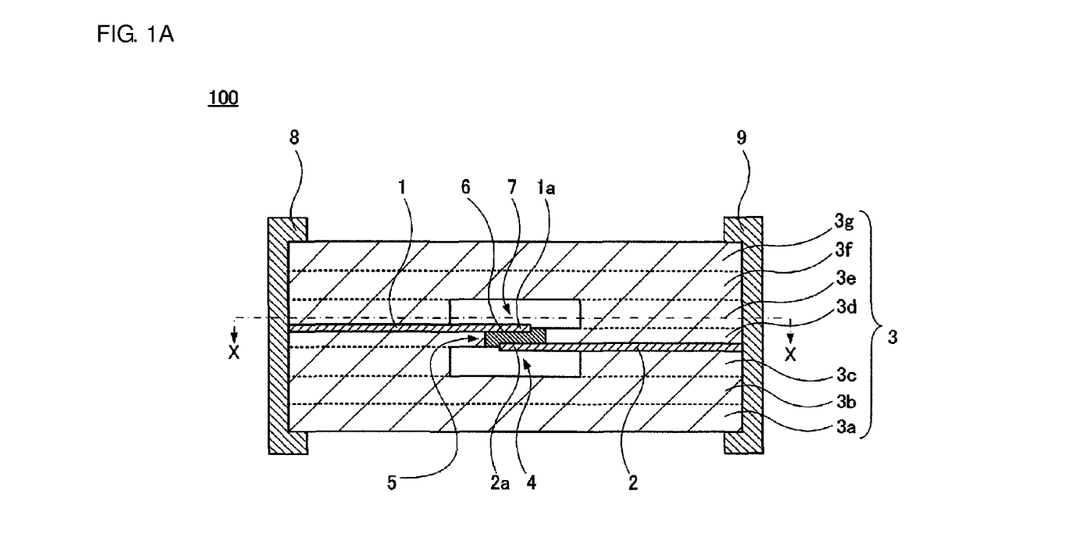
Figure 1B:
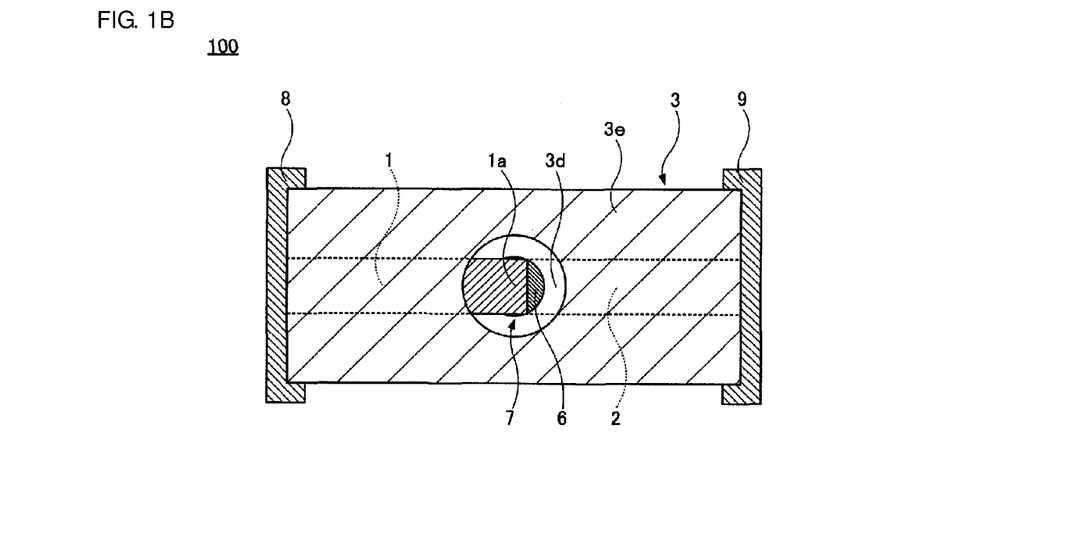

FIGS. 1A and 1B show an ESD protection device 100 according to a first preferred embodiment of the present invention. FIGS. 1A and 1B are each a sectional view of the ESD protection device 100, and FIG. 1B is a section taken along a line X-X in FIG. 1A.

The ESD protection device 100 includes a first discharge electrode 1 and a second discharge electrode 2. The first discharge electrode 1 includes a discharge portion 1a at or near its tip end. The second discharge electrode 2 includes a discharge portion 2a at or near its tip end. The first discharge electrode 1 and the second discharge electrode 2 include, for example, a metal including Cu as a primary component.

The ESD protection device 100 includes a multilayer substrate 3 that is preferably formed by laminating insulating layers 3a to 3g into an integral body. The insulating layers 3a to 3g each include ceramic, for example. While the multilayer substrate 3 includes the seven insulating layers 3a to 3g in this preferred embodiment, the number of the insulating layers is able to be optionally selected and is not limited to seven.

The insulating layer 3a is located in a lowermost layer of the multilayer substrate 3.

The insulating layer 3b is located in a second layer, counting from the bottom of the multilayer substrate 3.

The insulating layer 3c includes a cavity 4 that penetrates between upper and lower principal surfaces of the insulating layer 3c. In this preferred embodiment, the cavity 4 includes a circular tubular or substantially circular tubular shape.

The second discharge electrode 2 is located between the insulating layer 3c and the insulating layer 3d. The second discharge electrode includes a strip shape. The discharge portion 2a of the second discharge electrode 2 is at least partly overlapped with a discharge auxiliary electrode 6 described later.

The insulating layer 3d includes a through-hole 5 that penetrates between upper and lower principal surfaces of the insulating layer 3d. In this preferred embodiment, the through-hole 5 includes a circular tubular or substantially circular tubular shape. The discharge auxiliary electrode 6 is filled in the through-hole 5 included in the insulating layer 3d.

The discharge auxiliary electrode 6 provides insulation properties during operation of the ESD protection device 100 and also provides a discharge between the discharge portion 1a of the first discharge electrode 1 and the discharge portion 2a of the second discharge electrode 2 when a voltage applied between the first discharge electrode 1 and the second discharge electrode 2 exceeds a predetermined threshold voltage.

The discharge auxiliary electrode 6 includes at least one solid component selected from among a conductive particle, a semiconductor particle, a conductive particle coated with an inorganic material, an insulating particle, and so on. The conductive particle is, for example, a Cu particle or an Ag particle. The semiconductor particle is a particle of SiC or ZnO, for example. The conductive particle coated with the inorganic material is, for example, a Cu or Ag particle covered (coated) with an $Al_2O_3$ particle. The insulating particle is a particle of insulating ceramic, for example. Many minute voids may be dispersedly included in the discharge auxiliary electrode 6.

The first discharge electrode 1 is located between the insulating layer 3d and the insulating layer 3e. The first discharge electrode includes a strip shape. The discharge portion 1a of the first discharge electrode 1 is at least partly overlapped with the discharge auxiliary electrode 6.

The insulating layer 3e includes a cavity 7 that penetrates between upper and lower principal surfaces of the insulating layer 3e. The cavity 7 includes a circular tubular or substantially circular tubular shape.

The insulating layer 3f is located in a second layer, counting from the top of the multilayer substrate 3.

The insulating layer 3g is located in an uppermost layer of the multilayer substrate 3.

Outer electrodes 8 and 9 are provided at opposing ends of the multilayer substrate 3. The outer electrode 8 is electrically connected to the first discharge electrode 1, and the outer electrode 9 is electrically connected to the second discharge electrode 2. Each of the outer electrodes 8 and 9 includes, for example, a metal including Cu as a primary component, and a plating layer of Ni—Sn, for example, is included on a surface of each of the outer electrodes 8 and 9.

In the ESD protection device 100 of the above-described structure according to the first preferred embodiment, when the ESD occurs on an electronic device and an excessive voltage is applied between the first discharge electrode 1 and the second discharge electrode 2, a discharge occurs between the discharge portion 1a of the first discharge electrode 1 and the discharge portion 2a of the second discharge electrode 2.

On that occasion, a temperature of the discharge auxiliary electrode 6 rises due to heat generated by the discharge. In the ESD protection device 100, however, since the discharge auxiliary electrode 6 is sandwiched between the cavities 4 and 7, the heat is able to be dissipated efficiently and degradation of IR in the discharge auxiliary electrode 6 and the like is significantly reduced or prevented. More specifically, a portion of the heat of the discharge auxiliary electrode 6 is dissipated by being directly conducted to the cavities 4 and 7. Another portion of the heat of the discharge auxiliary electrode 6 is dissipated by being conducted to the cavities 4 and 7 after passing through the discharge portion 1a of the first discharge electrode 1, the discharge portion 2a of the second discharge electrode 2, and the insulating layer 3d. Still another portion of the heat of the discharge auxiliary electrode 6 is dissipated by being conducted to the first discharge electrode 1 and the second discharge electrode 2 after passing through the discharge portion 1a of the first discharge electrode 1, the discharge portion 2a of the second discharge electrode 2, and the insulating layer 3d. Still another portion of the heat of the discharge auxiliary electrode 6 is dissipated through the insulating layer 3d.

Since the degradation of IR due to the discharge is significantly reduced or prevented, the ESD protection device 100 is able to be used repeatedly even after the discharge.

The ESD protection device 100 of the above-described structure according to the first preferred embodiment is able to be manufactured, for example, by a method described below.

(1) Fabrication of Ceramic Green Sheets

Ceramic green sheets that form the insulating layers 3a to 3g were fabricated as follows. A material with a composition including Ba, Al and Si as primary components (for example, a BAS material) was used as a ceramic material. First, individual basic materials were prepared and mixed at a ratio to obtain a predetermined composition, and were calcined at about 800° C. to about 1000° C. Then, powder obtained with the calcination of the BAS material was pulverized for 12 hours by a zirconia ball mill, and ceramic powder was obtained. Then, an organic solvent, for example, toluene or Ekinen, was added to and mixed with the obtained ceramic powder. By further adding and mixing a binder and a plasticizer, ceramic slurry was obtained. Then, the obtained ceramic slurry was formed into ceramic green sheets with thicknesses of about 10 µm and about 50 µm, for example, by a doctor blade method. It is to be noted that the ceramic green sheets obtained as described above are each a mother sheet for fabricating the large number of ESD protection devices 100 together, and that each sheet is divided into individual elements in a later step.

(2) Preparation of Conductive Paste for Discharge Electrode

A conductive paste that forms each of the first discharge electrode 1 and the second discharge electrode 2 was prepared. More specifically, the conductive paste for the discharge electrode was prepared by combining about 40% by weight of Cu powder with an average particle size of about 1 µm, about 40% by weight of Cu powder with an average particle size of about 3 µm, and about 20% by weight of organic vehicle that was prepared with dissolution of ethyl cellulose into terpineol, and by mixing the blend with the aid of three rolls, for example.

(3) Preparation of Mixed Paste for Discharge Auxiliary Electrode

A mixed paste that forms the discharge auxiliary electrode 6 was prepared. More specifically, the mixed paste for the discharge auxiliary electrode was obtained by combining core/shell powder with an average particle size of about 2 µm, the core/shell powder including a core including Cu powder covered (coated) with a shell including $Al_2O_3$ powder, and ceramic powder with an average particle size of about 6 µm, the ceramic powder having a composition including Ba, Al and Si as primary components, at a ratio of 70:30 in terms of % by volume, by adding a binder resin and a solvent to the blend, and by mixing them under stirring with the aid of three rolls. In the mixed paste, a ratio of a total of the core/shell powder and the ceramic powder to a total of the binder resin, for example, ethyl cellulose, and the solvent was set to about 80:20 in terms of % by volume.

(4) Preparation of Cavity Forming Paste

A cavity forming paste that forms the cavities 4 and 7 was prepared. More specifically, the cavity forming paste was prepared by combining about 38% by weight of cross-linked acrylic resin beads with an average particle size of about 1 µm, and about 62% by weight of organic vehicle that was prepared with dissolution of about 10% by volume of ETHOCEL (ethyl cellulose resin) into terpineol, and by mixing the blend with the aid of three rolls, for example.

(5) Preparation of Conductive Paste for Outer Electrode

A conductive paste that forms each of the outer electrodes 8 and 9 was prepared. More specifically, the conductive paste for the outer electrode was prepared by combining about 80% by weight of Cu powder with an average particle size of about 1 µm, about 5% by weight of borosilicate alkali glass frit with a transition point of about 620° C., a softening point of about 720° C., and an average particle size of about 1 µm, and about 15% by weight of organic vehicle that was prepared with dissolution of ethyl cellulose into terpineol, and by mixing the blend with the aid of three rolls, for example.

(6) Formation of Through-Hole and Filling of Paste for Discharge Auxiliary Electrode One of the ceramic green sheets was subjected to processing in order to form the discharge auxiliary electrode 6 in the insulating layer 3d. More specifically, the through-hole 5 with a diameter of about 100 µm was formed in the ceramic green sheet with the thickness of about 10 µm by mechanical processing or laser processing, for example. It is to be noted that as the thickness of the insulating layer 3d including the discharge auxiliary electrode 6 formed therein reduces, ESD response increases and discharge occurs at a lower voltage. In this preferred embodiment, as described above, the thickness of the multilayer substrate 3d was set to about 10 µm, for example, in the stage of the ceramic green sheet. Then, the above-described mixed paste for the discharge auxiliary electrode was filled into the through-hole 5 formed in the ceramic green sheet for the insulating layer 3d, and was dried.

(7) Formation of Through-Hole and Filling of Cavity Forming Paste

Two of the ceramic green sheets were subjected to processing in order to form the cavity 4 in the insulating layer 3c and the cavity 7 in the insulating layer 3e. More specifically, a through-hole with a diameter of about 200 µm was formed in each of the two ceramic green sheets with the thickness of about 50 µm by mechanical processing or laser processing, for example. Then, the above-described cavity forming paste was filled into each of the through-holes formed in the ceramic green sheets for the insulating layers 3c and 3e, and was dried.

(8) Coating of Conductive Paste for Discharge Electrode

To form the first discharge electrode 1, the above-described conductive paste for the discharge electrode was applied, by a screen printing method, to be coated in a desired shape on the green sheet for the insulating layer 3d in which the through-hole 5 was filled with the paste for the discharge auxiliary electrode. Likewise, to form the second discharge electrode 2, the above-described conductive paste for the discharge electrode was applied, by a screen printing method, to be coated in a desired shape on the green sheet for the insulating layer 3c in which the through-hole was filled with the cavity forming paste.

(9) Lamination and Pressure Bonding of Ceramic Green Sheets

An unfired mother laminate was fabricated by successively laminating the ceramic green sheets for the insulating layers 3a to 3g, and by pressure-bonding those sheets. The unfired mother laminate had a thickness of about 0.3 mm, for example.

(10) Cutting

The unfired mother laminate was cut into individual laminates each having a vertical size of about 1.0 mm and a horizontal size of about 0.5 mm, for example.

(11) Firing

The individual unfired laminates were fired in accordance with a predetermined firing profile in an $N_2$ atmosphere, and thus the individual multilayer substrates 3 were fabricated. It is to be noted that an atmosphere for the firing may be an open-air atmosphere.

(12) Formation of Outer Electrodes

The outer electrodes 8 and 9 were formed at both the ends of the multilayer substrate 3. More specifically, the conductive paste for the outer electrode was first applied to both the ends of the multilayer substrate 3, and was then baked. Thereafter, an Ni—Sn plating layer was formed on the baked paste by electrolytic plating.

The ESD protection device 100 according to the first preferred embodiment was completed through the above-described steps.

While, in the above-described manufacturing method, a material with a composition including Ba, Al and Si as primary components (for example, a BAS material) was used as the ceramic material to form the multilayer substrate 3 (for example, the insulating layers 3a to 3g), the type of the ceramic material is not limited to the above-described example, and it is able to be optionally selected. Other examples of the ceramic material include LTCC (Low Temperature Co-fired Ceramics) materials obtained by adding glass or the like to $Al_2O_3$, cordierite, mullite, forsterite, $CaZrO_3$, or the like, and HTCC (High Temperature Co-fired Ceramics) materials for example, $Al_2O_3$, cordierite, mullite, and forsterite, as well as ferrite materials, dielectric materials, and resin materials.

The metal of the primary component of the discharge electrode and the outer electrode is not limited to Cu, and the metal may be Ag, Pd, Pt, Al, Ni, W, or a combination of two or more among them. However, the metal of the primary component of the discharge electrode and the outer electrode is preferably a metal with a high thermal conductivity. Accordingly, Cu or Ag is preferably included as the metal of the primary component of the discharge electrode and the outer electrode.

The material of the discharge auxiliary electrode is not limited to the combination of a conductive particle coated with an inorganic material (for example, core/shell powder including a core including Cu powder coated with a shell including $Al_2O_3$ powder) and an insulating particle (for example, ceramic powder), the discharge auxiliary electrode may include one or a combination of plural ones optionally selected from among the conductive particle, the semiconductor particle, the conductive particle coated with the inorganic material, and the insulating particle. Moreover, many minute voids may be dispersedly formed in the discharge auxiliary electrode by mixing beads that melt, evaporate, or dissolve at high temperature, for example, acrylic resin beads, into the mixed paste for the discharge auxiliary electrode.

The following experiments were performed to confirm effectiveness of various preferred embodiments of the present invention.

Experimental Example 1

Three hundred of the ESD protection devices 100 according to the first preferred embodiment were prepared as samples representing an Experimental Example 1.

In addition, three hundred ESD protection devices, each of which was obtained by excluding the cavity 4 and the cavity 7 from the ESD protection device 100 according to the first preferred embodiment, were prepared as samples representing a Comparative Example 1. Each of the ESD protection devices representing the Comparative Example 1 included the same or substantially the same structure as the ESD protection device 100 according to the first preferred embodiment except for the above-mentioned point.

In the Experimental Example 1 and the Comparative Example 1, an operation rate was checked by changing an applied ESD voltage. The applied ESD voltage was changed to three values of about 2.0 kV, about 2.5 kV, and about 3.0 kV, and the number of samples tested at each voltage was set to 100. More specifically, in accordance with the IEC standards (IEC61000-4-2), the ESD was applied with contact discharge, and the operation rate at each voltage was checked.

Table 1 lists the operation rates in the Experimental Example 1 and the Comparative Example 1. In Table 1, the case where the operation rate is less than 10% is denoted by "X", the case where the operation rate is not less than 10% and less than 50% is denoted by "Δ", the case where the operation rate is not less than 50% and less than 80% is denoted by "○", and the case where the operation rate is more than 80% is denoted by "⊙".

TABLE 1

|  | Operation Performance | | |
| --- | --- | --- | --- |
|  | 2.0 kV | 2.5 kV | 3.0 kV |
| Experimental Example 1 (with cavities) | ○ | ⊙ | ⊙ |
| Comparative Example 1 (no cavities) | ○ | ⊙ | ⊙ |

(Operation rate X: 0 to 10%, Δ: 10 to 50%, ○: 50 to 80%, ⊙: 80 to 100%)

As shown in Table 1, the operation rate was not less than 50% and less than 80% at about 2.0 kV, and not less than about 80% at 2.5 kV in both the Experimental Example 1 and the Comparative Example 1.

Experimental Example 2

One-hundred fifty of the ESD protection devices 100 according to the first preferred embodiment were prepared as samples representing an Experimental Example 2.

In addition, one-hundred fifty ESD protection devices, each of which was obtained by excluding the cavity 4 and the cavity from the ESD protection device 100 according to the first preferred embodiment, were prepared as samples representing a Comparative Example 2. Each of the ESD protection devices representing the Comparative Example 2 included the same or substantially the same structure as the ESD protection device 100 according to the first preferred embodiment except for the above-mentioned point.

In the Experimental Example 2 and the Comparative Example 2, the ESD was applied to each of the ESD protection devices 100 times continuously. The applied ESD voltage was changed to three values of about 8 kV, about 10 kV, and about 12 kV, and the number of samples tested at each voltage was set to 50. More specifically, in accordance with the IEC standards (IEC61000-4-2), the ESD was applied 100 times continuously with contact discharge, and a good product rate after the end of the application of each voltage was checked.

Table 2 lists the good product rates in the Experimental Example 2 and the Comparative Example 2. In Table 2, the case where the good product rate is less than 10% is denoted by "X", the case where the good product rate is not less than 10% and less than 50% is denoted by "Δ", the case where the good product rate is not less than 50% and less than 80% is denoted by "○", and the case where the good product rate is more than 80% is denoted by "⊙".

TABLE 2

|  | Resistance to Degradation of IR | | |
| --- | --- | --- | --- |
|  | 8 kV | 10 kV | 12 kV |
| Experimental Example 2 (with cavities) | ⊙ | ○ | Δ |
| Comparative Example 2 (no cavities) | Δ | X | X |

(Good product rate X: 0 to 10%, Δ: 10 to 50%, ○: 50 to 80%, ⊙: 80 to 100%)

As shown in Table 2, in the Experimental Example 2, the good product rate of not less than 80% was maintained even after repeatedly applying the ESD at about 8 kV 100 times. Furthermore, in the Experimental Example 2, the good product rate of not less than 50% was maintained even after repeatedly applying the ESD at about 10 kV 100 times.

On the other hand, in the Comparative Example 2, the good product rate was reduced to a level of less than 50% after repeatedly applying the ESD at about 8 kV 100 times.

From the above results, it was confirmed that the degradation of IR was significantly reduced or prevented in the ESD protection device according to the first preferred embodiment.

Second to Seventh Preferred Embodiments

FIGS. 2A to 2F show ESD protection devices 200 to 700 according to second to seventh preferred embodiments of the present invention, respectively. Specifically, FIGS. 2A to 2F are each a sectional view taken along a similar section of the insulating layer 3e to that shown in FIG. 1B.

In the ESD protection devices 200 to 700 according to the second to seventh preferred embodiments, shapes, sizes, formed positions, and the like of the first discharge electrode and the second discharge electrode are changed from those in the ESD protection device 100 according to the first preferred embodiment. Other features and elements of each of the ESD protection devices 200 to 700 are the same or substantially the same as those in the ESD protection device 100 according to the first preferred embodiment.

Figure 2A:
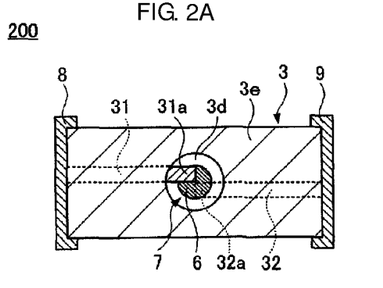
FIGS. 2A to 2F are sectional views of ESD protection devices 200 to 700 according to second to seventh preferred embodiments of the present invention, respectively.

In the ESD protection device 200 according to the second preferred embodiment, shown in FIG. 2A, widths of a first discharge electrode 31 and a second discharge electrode 32 are reduced in comparison with those in the ESD protection device 100 according to the first preferred embodiment, and a discharge portion 31a of the first discharge electrode 31 and a discharge portion 32a of the second discharge electrode 32 are located away from each other in an oblique direction.

Figure 2B:
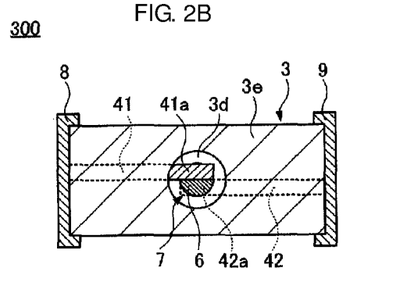

In the ESD protection device 300 according to the third preferred embodiment, shown in FIG. 2B, lengths of a first discharge electrode 41 and a second discharge electrode 42 are increased in comparison with those in the ESD protection device 200 according to the second preferred embodiment.

Figure 2C:
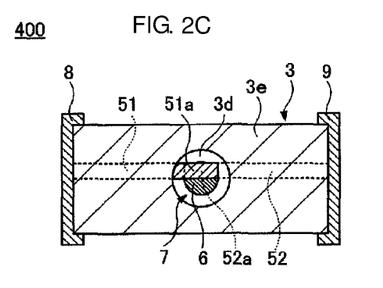

In the ESD protection device 400 according to the fourth preferred embodiment, shown in FIG. 2C, a second discharge electrode 52 is provided by shifting a position of the second discharge electrode 42 in the ESD protection device 300 according to the third preferred embodiment upward in FIG. 2C. A discharge portion 51a of a first discharge electrode 51 and a discharge portion 52a of the second discharge electrode 52 are located in an overlapped relation.

Figure 2D:
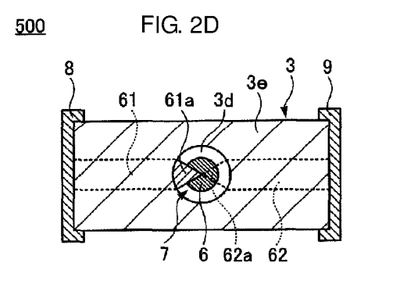

In the ESD protection device 500 according to the fifth preferred embodiment, shown in FIG. 2D, a width of a first discharge electrode 61 and a width of a second discharge electrode 62 are set to be the same or substantially the same as those in the ESD protection device 100 according to the first preferred embodiment. In addition, a tip of a discharge portion 61a of the first discharge electrode 61 and a tip of a discharge portion 62a of the second discharge electrode 62 include a pointed shape.

Figure 2E:
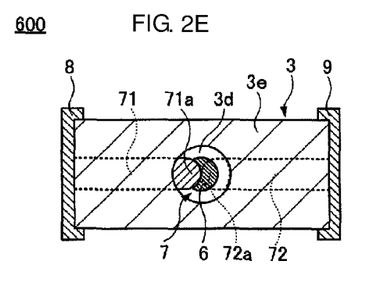

In the ESD protection device 600 according to the sixth preferred embodiment, shown in FIG. 2E, a width of a first discharge electrode 71 and a width of a second discharge electrode 72 are set to be the same or substantially the same as those in the ESD protection device 100 according to the first preferred embodiment. In addition, a tip of a discharge portion 71a of the first discharge electrode 71 and a tip of a discharge portion 72a of the second discharge electrode 72 have a rounded shape.

Figure 2F:
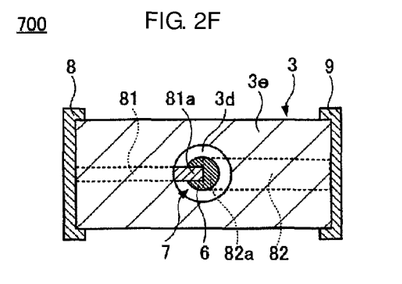

In the ESD protection device 700 according to the seventh preferred embodiment, shown in FIG. 2F, a width of a first discharge electrode 81 and a width of a second discharge electrode 82 are set to be different from each other. The width of the first discharge electrode 81 may be smaller than the width of the second discharge electrode 82, for example.

Thus, in ESD protection devices of various preferred embodiments of the present invention, the shapes, the sizes, the formed positions, and the like of the first discharge electrode and the second discharge electrode are able to be changed variously.

Eighth Preferred Embodiment

Figure 3A:
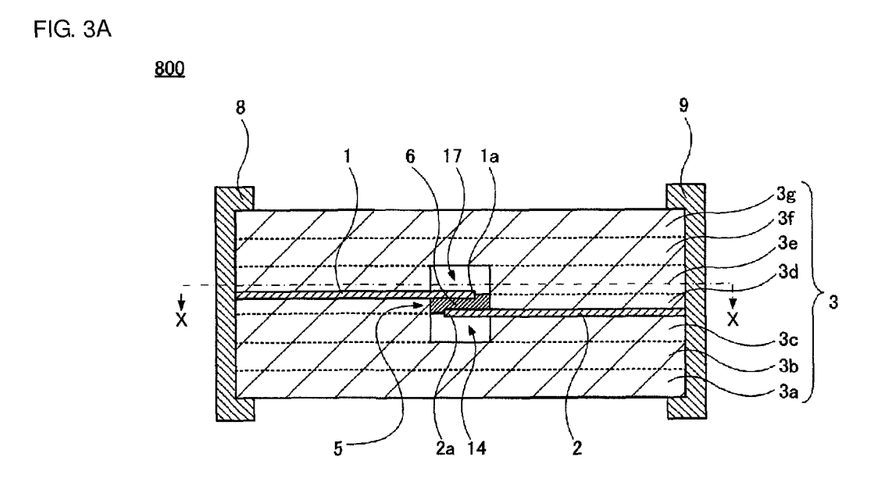
Figure 3B:
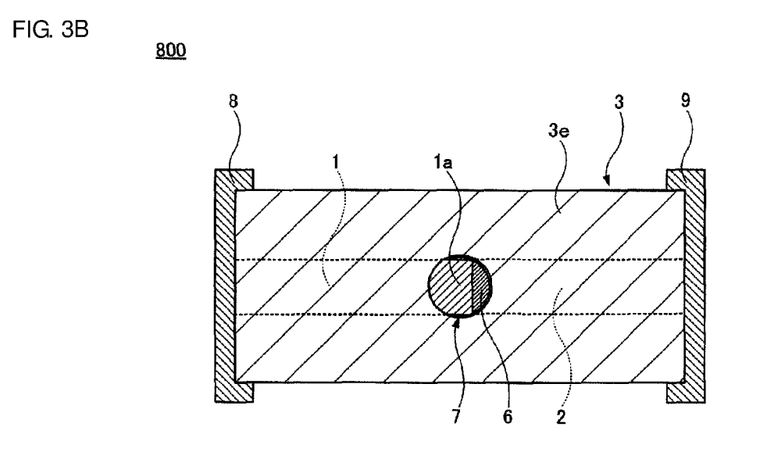

FIGS. 3A and 3B show an ESD protection device 800 according to an eighth preferred embodiment of the present invention. FIGS. 3A and 3B are each a sectional view of the ESD protection device 800, and FIG. 3B is a section taken along a line X-X in FIG. 3A.

In the ESD protection device 100 according to the first preferred embodiment, shown in FIGS. 1A and 1B, the diameter of the discharge auxiliary electrode 6 (for example, the through-hole 5) and the diameter of each of the cavity 4 and the cavity 7 are different from each other. More specifically, the diameter of the discharge auxiliary electrode 6 (for example, the through-hole 5) is about 100 μm in the stage of the ceramic green sheet, and the diameter of each of the cavities 4 and 7 is about 200 μm in the stage of the ceramic green sheet.

On the other hand, in the ESD protection device 800, the diameter of each of the cavities 14 and 17 is set to be the same or substantially the same as that of the discharge auxiliary electrode 6, and it is about 100 μm in the stage of the ceramic green sheet. Other features and elements of the ESD protection device 800 are the same or substantially the same as those in the ESD protection device 100 according to the first preferred embodiment.

In the case where the diameter of each of the cavities 14 and 17 is set to be the same or substantially the same as that of the discharge auxiliary electrode 6, the same jig (for example, the same punch with a certain diameter) is able to form the cavities 14 and 17 and the discharge auxiliary electrode 6, and productivity in manufacturing of the ESD protection device is able to be significantly increased.

Ninth Preferred Embodiment

Figure 4A:
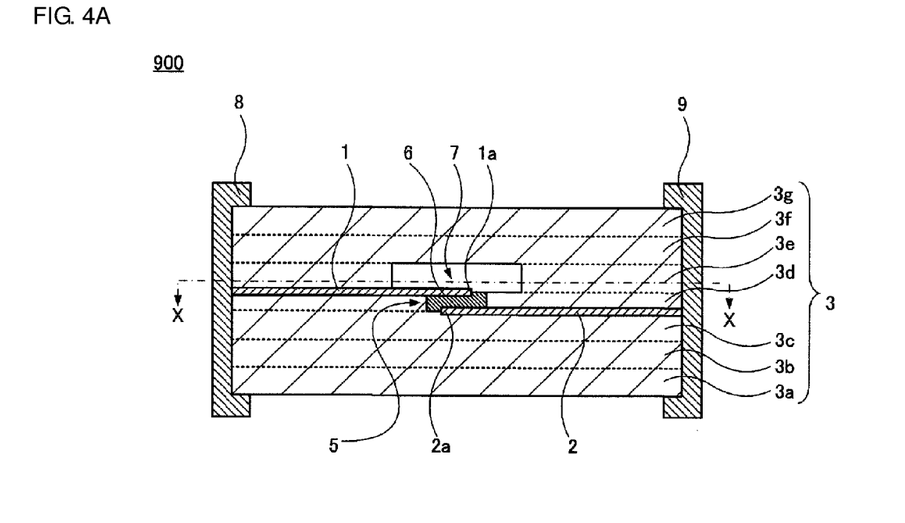
Figure 4B:
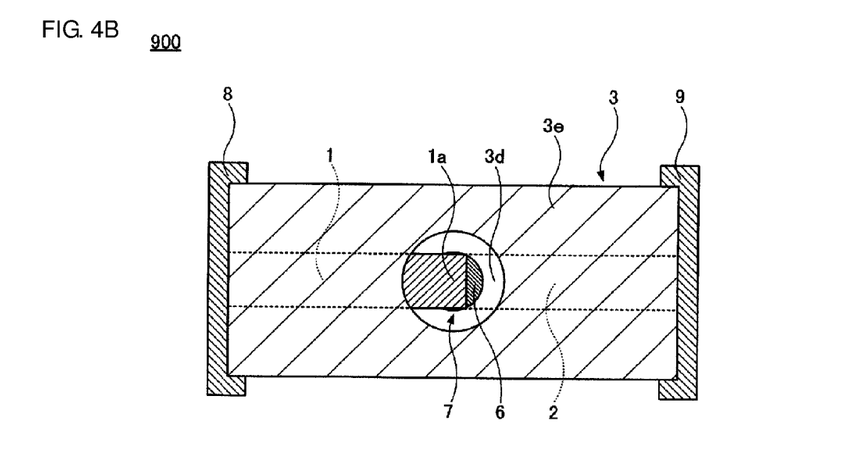

FIGS. 4A and 4B show an ESD protection device 900 according to a ninth preferred embodiment of the present invention. FIGS. 4A and 4B are each a sectional view of the ESD protection device 900, and FIG. 4B is a section taken along a line X-X in FIG. 4A.

The ESD protection device 100 according to the first preferred embodiment, shown in FIGS. 1A and 1B, includes the two cavities 4 and 7.

On the other hand, in the ESD protection device 900, the cavity 4 is omitted and only one cavity 7 is provided. Other features and elements of the ESD protection device 900 are the same or substantially the same as those in the ESD protection device 100 according to the first preferred embodiment.

Thus, an ESD protection device according to a preferred embodiment of the present invention is not always required to include two cavities, and the degradation of IR is still able to be significantly reduced or prevented by including at least one cavity.

The ESD protection devices 100 to 900 according to the first to ninth preferred embodiments have been described above. However, the present invention is not limited to the specific features and elements described above, and the present invention is able to be variously modified in accordance with the scope and spirit of the preferred embodiments of the present invention as described above.

For instance, while the multilayer substrate 3 (for example, the insulating layers 3a to 3g) includes ceramic in the ESD protection devices 100 to 900 according to the first to ninth preferred embodiments, the material of the multilayer substrate 3 is able to be optionally selected, and the multilayer substrate 3 may include, for example, resin.

While the shapes of the cavities 4, 7, 14 and 17 and the shapes of the discharge auxiliary electrode 6 (for example, the through-hole 5) are all circular tubular or substantially circular tubular in the ESD protection devices 100 to 900 according to the first to ninth preferred embodiments, those shapes are able to be optionally selected, and the cavities 4, 7, 14 and 17 and/or the discharge auxiliary electrode 6 may have a rectangular columnar or substantially rectangular columnar shape, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An ESD protection device comprising:
a multilayer substrate that includes a plurality of laminated insulating layers;
a first discharge electrode and a second discharge electrode each of which is located between different ones of the laminated insulating layers of the multilayer substrate, and each of which includes a discharge portion at or near a tip end thereof;
a through-hole that penetrates between front and rear principal surfaces of at least one of the plurality of insulating layers; and
a discharge auxiliary electrode that is filled in the through-hole; wherein
the discharge portion of the first discharge electrode and the discharge portion of the second discharge electrode are opposed to each other in a lamination direction of the plurality of insulating layers with the discharge auxiliary electrode interposed between both the discharge portions; and
a cavity is provided within the multilayer substrate in at least one of a region positioned adjacent to or in a vicinity of the discharge portion of the first discharge electrode on an opposite side to the discharge auxiliary electrode and a region positioned adjacent to or in a vicinity of the discharge portion of the second discharge electrode on an opposite side to the discharge auxiliary electrode.

2. The ESD protection device according to claim 1, wherein
when the multilayer substrate is viewed in the lamination direction of the plurality of insulating layers, the discharge auxiliary electrode is at least partly overlapped with the discharge portion of the first discharge electrode and/or the discharge portion of the second discharge electrode; and
the discharge auxiliary electrode is in direct contact with the cavity in a region where the discharge auxiliary electrode is not overlapped with the discharge portion.

3. The ESD protection device according to claim 1, wherein the cavity is provided within the multilayer substrate in each of the region positioned adjacent to or in a vicinity of the discharge portion of the first discharge electrode on the opposite side to the discharge auxiliary electrode and the region positioned adjacent to or in a vicinity of the discharge portion of the second discharge electrode on the opposite side to the discharge auxiliary electrode.

4. The ESD protection device according to claim 1, wherein when the multilayer substrate is viewed in the lamination direction of the plurality of insulating layers, the cavity and the discharge auxiliary electrode are overlapped with each other in a same or substantially the same shape and same or substantially the same size.

5. The ESD protection device according to claim 1, wherein when the multilayer substrate is viewed in the lamination direction of the plurality of insulating layers, a size of the cavity is larger than a size of the discharge auxiliary electrode, and the cavity includes the discharge auxiliary electrode.

6. The ESD protection device according to claim 1, wherein the discharge auxiliary electrode includes at least one solid component selected from among a conductive particle, a semiconductor particle, a conductive particle coated with an inorganic material, and an insulating particle.

7. The ESD protection device according to claim 1, wherein each of the plurality of insulating layers includes a ceramic material.

8. The ESD protection device according to claim 1, wherein at least a lowermost layer of the plurality of insulating layers does not include the cavity.

9. The ESD protection device according to claim 1, wherein the cavity includes a circular tubular or substantially circular tubular shape portion.

10. The ESD protection device according to claim 1, wherein the first discharge electrode and the second discharge electrode each include a strip shape portion.

11. The ESD protection device according to claim 1, wherein a plurality of voids are included in the discharge auxiliary electrode.

12. The ESD protection device according to claim 1, further comprising a first outer electrode and a second outer electrode located at opposing ends of the multilayer substrate.

13. The ESD protection device according to claim 12, wherein the first outer electrode is electrically connected to the first discharge electrode, and the second outer electrode is electrically connected to the second discharge electrode.

14. The ESD protection device according to claim 1, wherein the tip of each of the first discharge electrode and the second discharge electrode has a pointed shape.

15. The ESD protection device according to claim 1, wherein the tip of each of the first discharge electrode and the second discharge electrode has a rounded shape.

16. The ESD protection device according to claim 1, wherein a width of the first discharge electrode is smaller than a width of the second discharge electrode.

17. The ESD protection device according to claim 1, wherein a second cavity is provided within the multilayer substrate.

18. The ESD protection device according to claim 9, wherein a diameter of the cavity is different from a diameter of the through-hole.

19. The ESD protection device according to claim 9, wherein the cavity and the second cavity each include a circular tubular or substantially circular tubular shape, and a diameter of the cavity is equal or substantially equal to a diameter of the through-hole.

20. A manufacturing method for an ESD protection device in which a cavity is provided within a multilayer substrate in at least one of a region positioned adjacent to or in a vicinity of a discharge portion of a first discharge electrode on an opposite side to a discharge auxiliary electrode and a region positioned adjacent to or in a vicinity of a discharge portion of a second discharge electrode on an opposite side to the discharge auxiliary electrode, the manufacturing method comprising:
fabricating ceramic green sheets;
preparing a conductive paste for the discharge electrode;
preparing a mixed paste for the discharge auxiliary electrode;
preparing a cavity forming paste that melts, evaporates, or dissolves in response to firing;
forming, in a predetermined one of the ceramic green sheets, a through-hole that penetrates between front and rear principal surfaces of the one ceramic green sheet, and filling the mixed paste for the discharge auxiliary electrode in the through-hole;
forming, in predetermined another one of the ceramic green sheets, a through-hole that penetrates between front and rear principal surfaces of the other one ceramic green sheet, and filling the cavity forming paste in the through-hole;
applying the conductive paste for the discharge electrode, in a predetermined shape, onto at least one principal surface of each of predetermined still other ones of the ceramic green sheets;
fabricating an unfired laminate by laminating the ceramic green sheets in a predetermined order; and
fabricating the multilayer substrate by firing the unfired laminate.

* * * * *